(12) United States Patent
Yamamoto et al.

(10) Patent No.: US 9,007,779 B2
(45) Date of Patent: Apr. 14, 2015

(54) ELECTRONIC APPARATUS AND HARD DISK DRIVE

(75) Inventors: Nobuhiro Yamamoto, Fussa (JP); Takahisa Funayama, Musashino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 571 days.

(21) Appl. No.: 13/358,432

(22) Filed: Jan. 25, 2012

(65) Prior Publication Data

US 2012/0120591 A1    May 17, 2012

Related U.S. Application Data

(63) Continuation of application No. 12/905,650, filed on Oct. 15, 2010, now abandoned.

(30) Foreign Application Priority Data

Mar. 29, 2010 (JP) .................... 2010-076046

(51) Int. Cl.
*H05K 5/00* (2006.01)
*H05K 7/00* (2006.01)
(Continued)

(52) U.S. Cl.
CPC ............ *H05K 1/0215* (2013.01); *G11B 25/043* (2013.01); *H05K 3/4007* (2013.01); *H05K 2201/0305* (2013.01); *H05K 2201/10409* (2013.01)

(58) Field of Classification Search
USPC ............... 361/679.01–679.09, 679.1–679.19, 361/679.21–679.29, 361/679.31–679.45, 361/679.55–679.6, 724–747; 292/1–62, 292/113, 169.11–169.23, 341.11–341.19; 369/75.1, 75.2, 75.11, 75.21, 76, 369/77.11, 77.21, 78, 79, 80, 81, 82; 348/14.07, 51–52, 177, 348/333.01–333.13, 739
See application file for complete search history.

(56) References Cited

U.S. PATENT DOCUMENTS 4,543,715 A   10/1985   Iadarola et al.
5,241,320 A    8/1993   Mizoguchi
(Continued)

FOREIGN PATENT DOCUMENTS

JP   61-142910   6/1986
JP    3-82565    8/1991
(Continued)

OTHER PUBLICATIONS

Japanese Patent Application No. 2011-207743, Decision of Rejection, mailed Feb. 1, 2012, (with English Translation).
(Continued)

*Primary Examiner* — Jerry Wu

(74) *Attorney, Agent, or Firm* — Blakely, Sokoloff, Taylor & Zafman LLP

(57) ABSTRACT

According to one embodiment, an electronic apparatus includes a case, a printed circuit board contained in the case and having a through-hole, and a fixing member including a shaft portion inserted in the through-hole and a head portion located at one end of the shaft portion. The electronic apparatus also includes copper foil provided on the printed circuit board, and a cover film including an opening portion configured to expose part of the copper foil. The opening portion is located at a position which is to be covered with the head portion, and the cover film covers the copper foil at positions other than the position where the opening portion is located. The electronic apparatus further includes a conductive material provided on the copper foil inside the opening portion and configured to electrically connect the head portion and the copper foil to each other.

10 Claims, 14 Drawing Sheets

(51) Int. Cl.
*H05K 1/16* (2006.01)
*H05K 1/02* (2006.01)
*G11B 25/04* (2006.01)
*H05K 3/40* (2006.01)

(56) References Cited

U.S. PATENT DOCUMENTS

| | | | |
|---|---|---|---|
| 5,326,937 A * | 7/1994 | Watanabe | 174/263 |
| 5,414,223 A | 5/1995 | Suski et al. | |
| 5,420,378 A * | 5/1995 | Estes et al. | 174/263 |
| 6,295,210 B1 | 9/2001 | Lanzone et al. | |
| 6,493,233 B1 | 12/2002 | De Lorenzo et al. | |
| 7,898,820 B2 | 3/2011 | Kao et al. | |
| 7,944,686 B2 | 5/2011 | Watanabe | |
| 2006/0125091 A1 | 6/2006 | Imai et al. | |
| 2007/0133122 A1* | 6/2007 | Kim et al. | 360/97.01 |
| 2008/0310090 A1* | 12/2008 | Oh | 361/681 |
| 2011/0235288 A1 | 9/2011 | Yamamoto et al. | |

FOREIGN PATENT DOCUMENTS

| | | |
|---|---|---|
| JP | 5-090983 | 4/1993 |
| JP | 5-2437546 | 9/1993 |
| JP | 7-145808 | 6/1995 |
| JP | 7-326832 | 12/1995 |
| JP | 9-073740 | 3/1997 |
| JP | 2002-198621 | 7/2002 |
| JP | 2002-310124 | 10/2002 |
| JP | 2003-112690 | 4/2003 |
| JP | 2005-316037 | 11/2005 |
| JP | 2006-088630 | 4/2006 |
| JP | 2006-100476 | 4/2006 |
| JP | 2006-128435 | 5/2006 |
| JP | 2006-156549 | 6/2006 |
| JP | 2007-134407 | 5/2007 |
| JP | 2007-294582 | 11/2007 |
| JP | 2007-315582 | 12/2007 |
| JP | 2007-333027 | 12/2007 |
| JP | 2009-123896 | 6/2009 |

OTHER PUBLICATIONS

Japanese Patent Application No. 2010-076046, Notice of Reasons for Rejection, mailed Jan. 18, 2011, (with English Translation).
Japanese Patent Application No. 2011-207743, Notice of Reasons for Rejection, mailed Nov. 15, 2011, (with English Translation).
U.S. Appl. No. 12/905,650, Non-Final Office Action received, mailed Oct. 25, 2011.

* cited by examiner

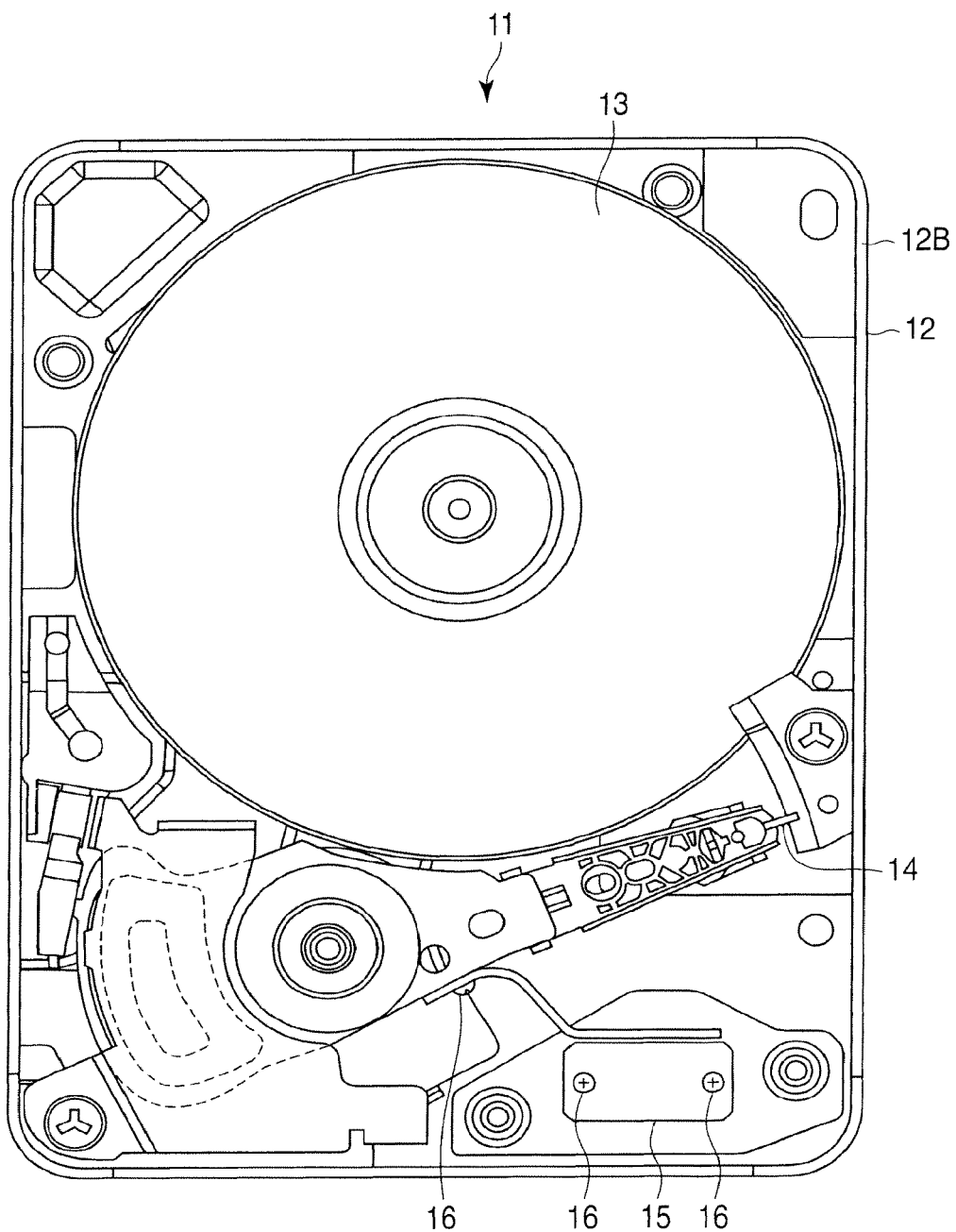
F I G. 3

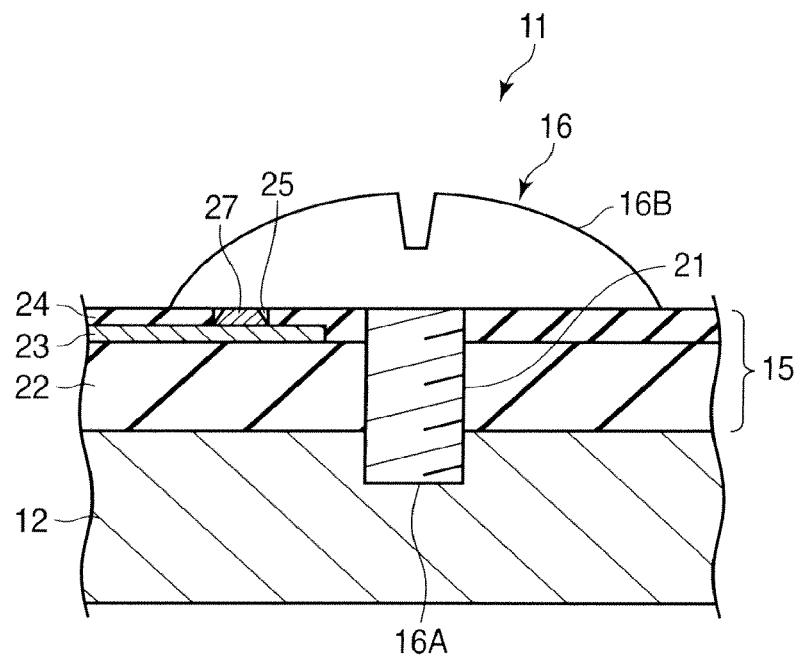
F I G. 4
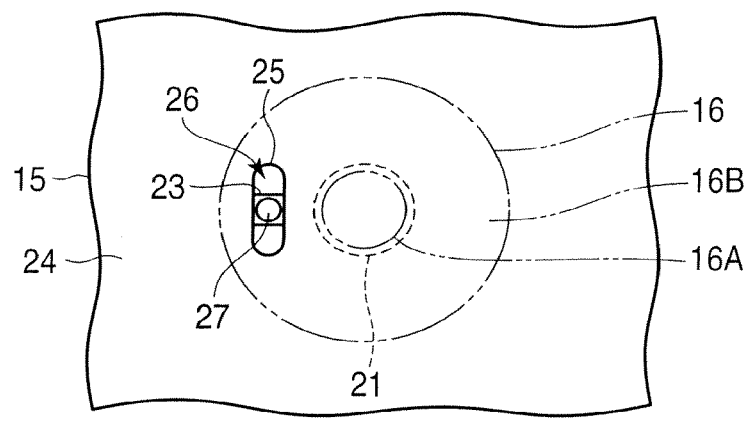
F I G. 5

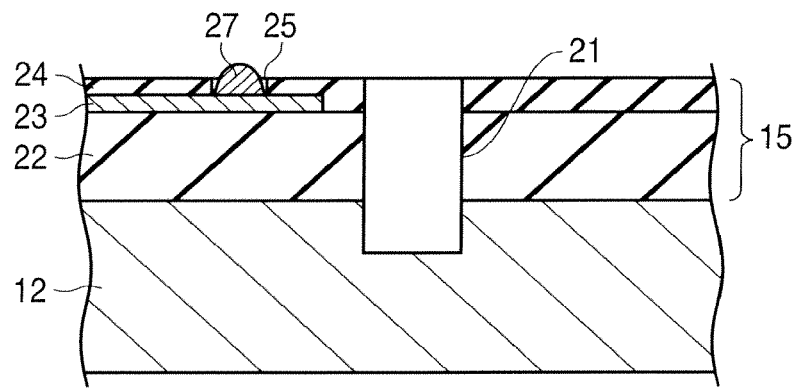
F I G. 6
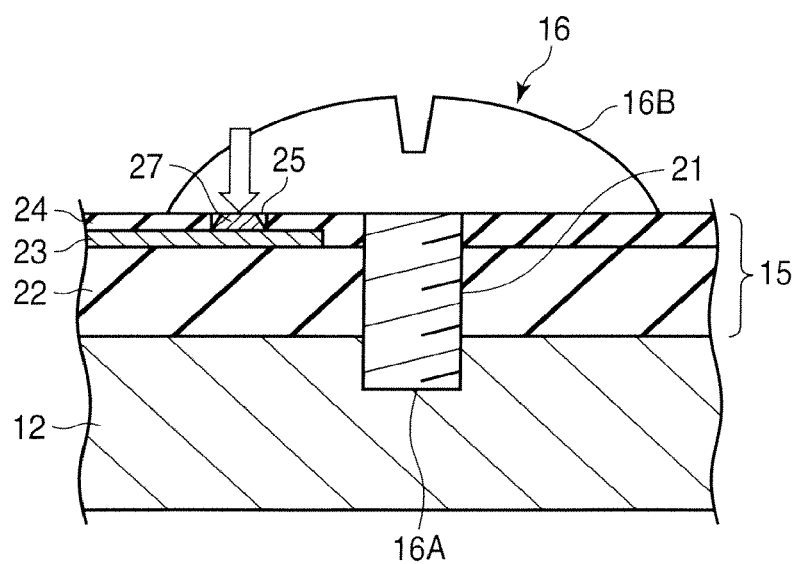
F I G. 7

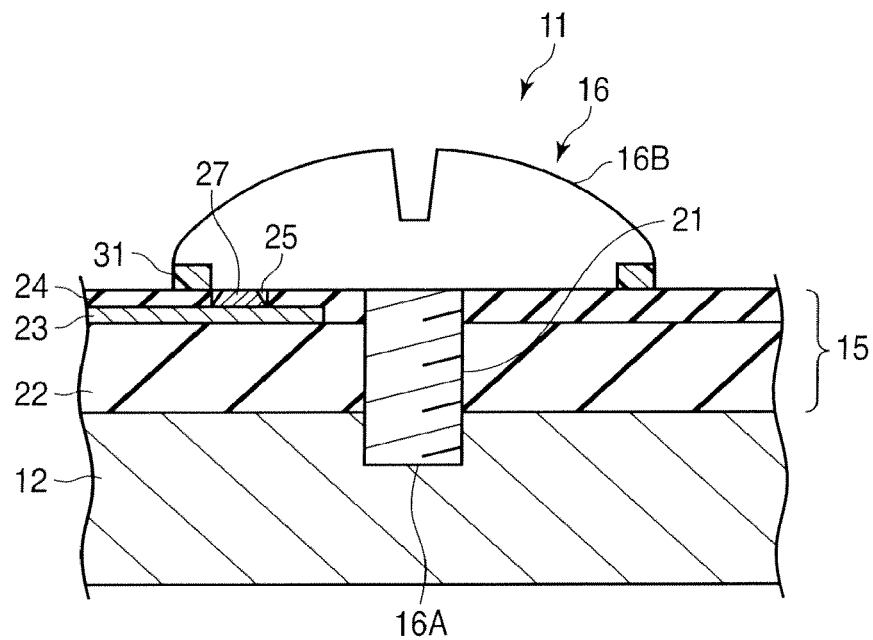
F I G. 13
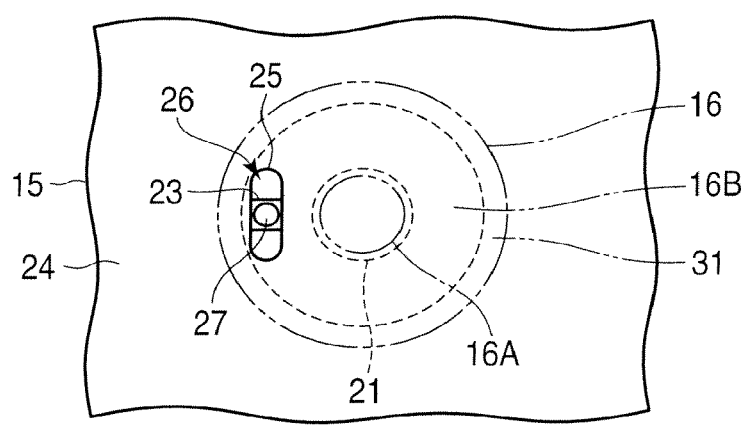
F I G. 14

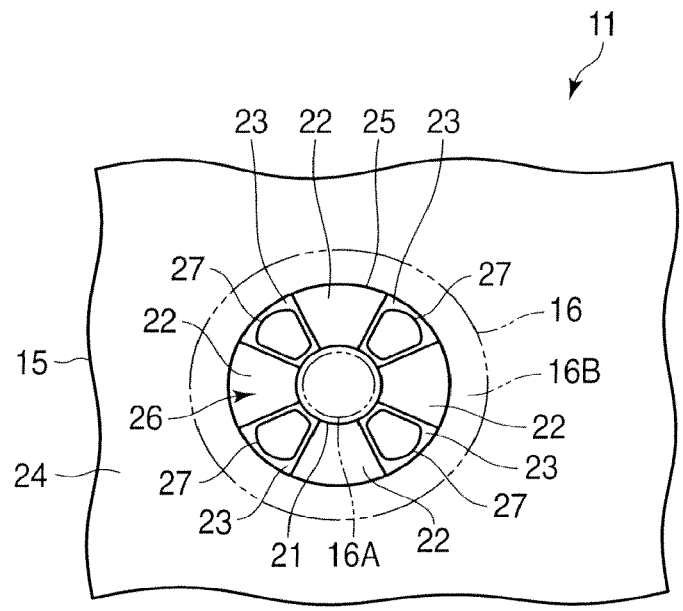
F I G. 15
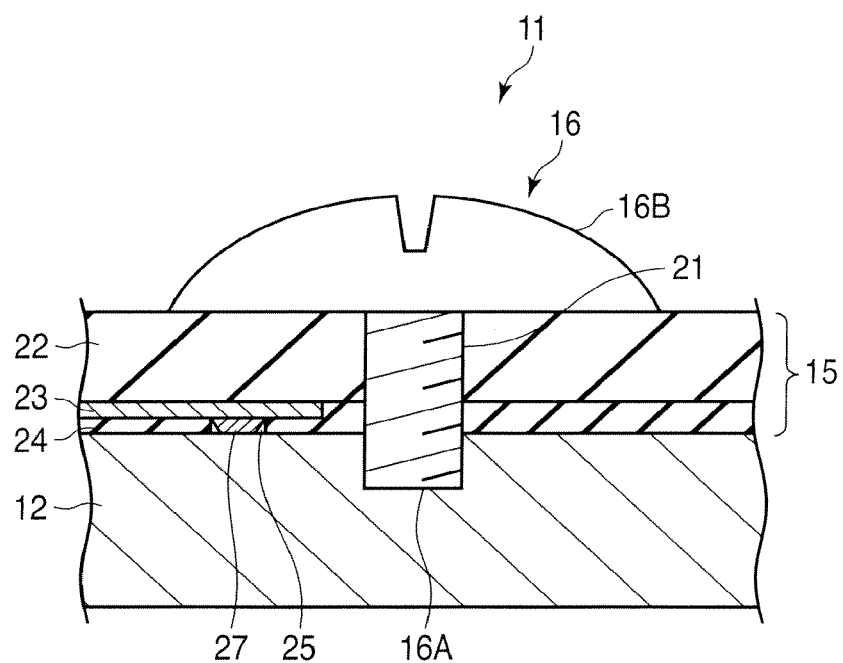
F I G. 16

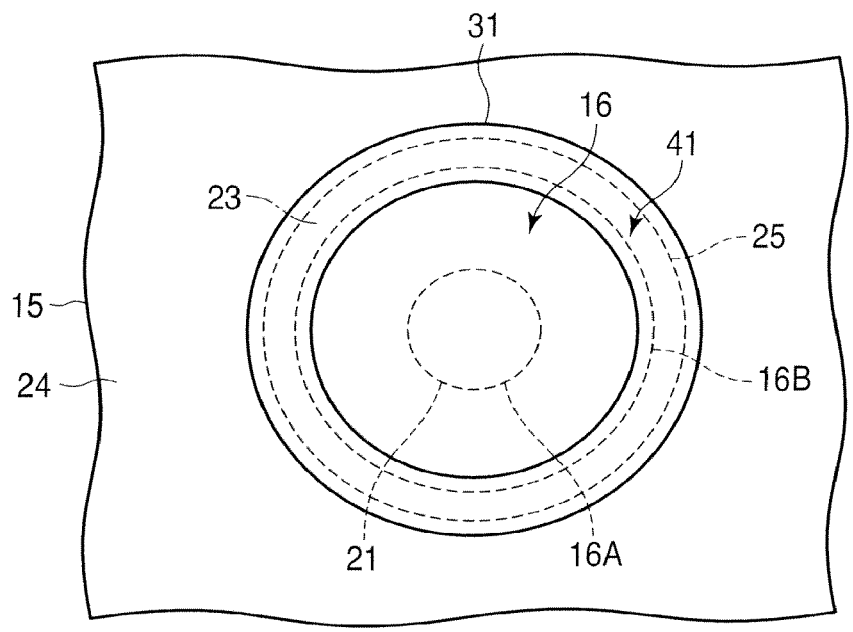
F I G. 19
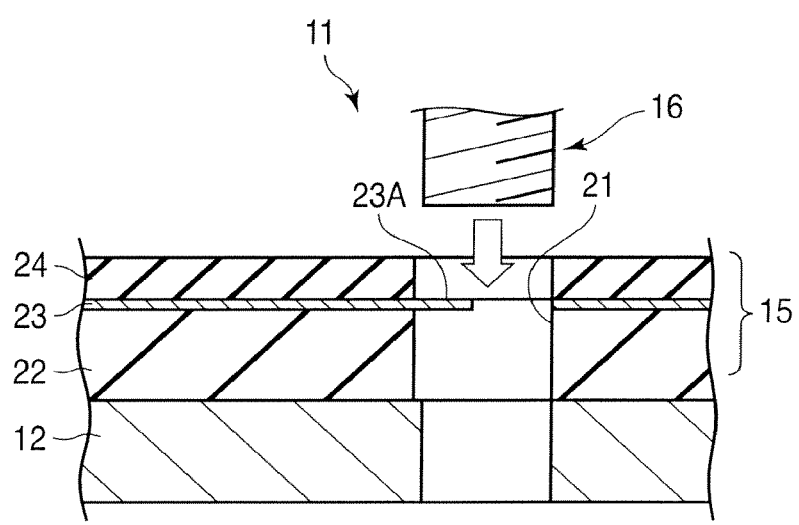
F I G. 20

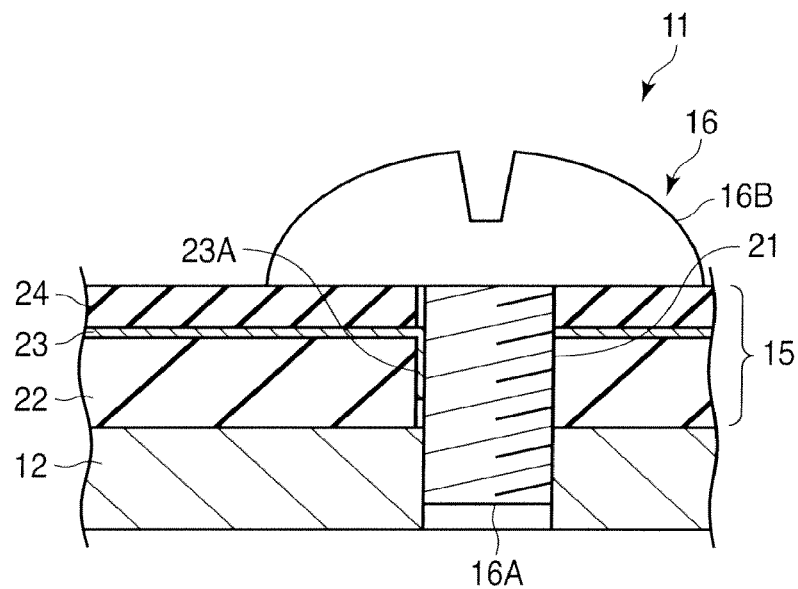
F I G. 21
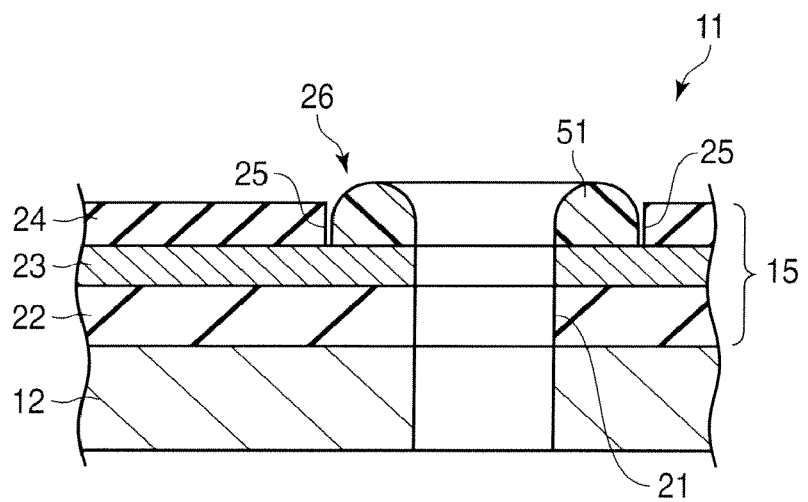
F I G. 22

ELECTRONIC APPARATUS AND HARD DISK DRIVE

CROSS-REFERENCE TO RELATED APPLICATIONS

This application is a continuation application of U.S. application Ser. No. 12/905,650, filed Oct. 15, 2010, now abandoned, which claims the benefit of priority from Japanese Patent Application No. 2010-076046, filed Mar. 29, 2010; the entire contents of which are incorporated herein by reference.

FIELD

Embodiments described herein relate generally to an electronic apparatus and a hard disk drive, which comprise a fixing member configured to secure a printed circuit board.

BACKGROUND

As disclosed in Jpn. Pat. Appln. KOKAI Publication No. 2009-123896, a printed circuit board inside the case of an electronic apparatus is normally secured to a supporting structure provided inside the case by means of fixing members, such as screws. The screws also serve as members for electrically connecting the printed circuit board to a ground provided inside the case of the electronic apparatus. In a general electronic apparatus, screws are commonly used for securing a printed circuit board. Since screws are used in many electronic apparatuses, there is a growing demand for an improved structure using screws.

In the above structure using screws, a solder connection is normally provided for electrical connection. The solder connection may have needle-like whiskers, and they may be a main cause of dust generated inside the electronic apparatus. Copper foil is normally used at positions where electric connection is required on the printed circuit board, but the copper foil may oxidize and become a copper oxide. Thus, the copper oxide may also be a main cause of dust.

To suppress the generation of dust and improve the reliability of an electronic apparatus, the solder connection and the copper foil are plated with gold in many cases. However, gold is costly, and the plating process necessitates disposal of a waste liquid, causing adverse impact on environment. Under the circumstances, there has been a demand for a process that can be used in place of the gold plating process.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 3 is an exemplary plan view showing a state where a first case is removed from the hard disk drive depicted in FIG. 1.

FIG. 4 is an exemplary longitudinal sectional view of a fixing member and a first printed circuit board, which are employed in the hard disk drive depicted in FIG. 3.

FIG. 5 is an exemplary plan view showing the first printed circuit board of the hard disk drive depicted in FIG. 3.

FIG. 6 is an exemplary sectional view illustrating a step of forming a fixing structure shown in FIG. 4.

FIG. 7 is an exemplary sectional view illustrating a step subsequent to the step of forming the fixing structure shown in FIG. 6.

FIG. 13 is an exemplary longitudinal sectional view of a fixing member and a first printed circuit board employed in a hard disk drive, which is an example of an electronic apparatus according to the second embodiment.

FIG. 14 is an exemplary plan view showing the first printed circuit board of the hard disk drive depicted in FIG. 13.

FIG. 15 is an exemplary plan view of a first printed circuit board employed in a hard disk drive, which is an example of an electronic apparatus according to the third embodiment.

FIG. 16 is an exemplary longitudinal sectional view of a fixing member and a first printed circuit board employed in a hard disk drive, which is an example of an electronic apparatus according to the fourth embodiment.

FIG. 19 is an exemplary plan view of the fixing member and first printed circuit board of the hard disk drive depicted in FIG. 18.

FIG. 20 is an exemplary sectional view illustrating a step of forming a fixing structure of a hard disk drive, which is an example of an electronic apparatus according to the sixth embodiment.

FIG. 21 is an exemplary sectional view illustrating a step subsequent to the step of forming the fixing structure of the hard disk drive depicted in FIG. 20.

FIG. 22 is an exemplary sectional view illustrating a step of forming a fixing structure of a hard disk drive, which is an example of an electronic apparatus according to the seventh embodiment.

DETAILED DESCRIPTION

Various embodiments will be described hereinafter with reference to the accompanying drawings.

In general, according to one embodiment, an electronic apparatus includes: a case; a printed circuit board contained in the case and having a through-hole; and a fixing member including a shaft portion inserted in the through-hole and a head portion located at one end of the shaft portion. The electronic apparatus also includes copper foil provided on the printed circuit board; and a cover film including an opening portion configured to expose part of the copper foil. The opening portion is located at a position which is to be covered with the head portion, and the cover film covers the copper foil at positions other than the position where the opening portion is located. The electronic apparatus further includes a conductive material provided on the copper foil inside the opening portion and configured to electrically connect the head portion and the copper foil to each other.

An electronic apparatus according to the first embodiment will now be described with reference to FIGS. 1 through 7.

Figure 1:
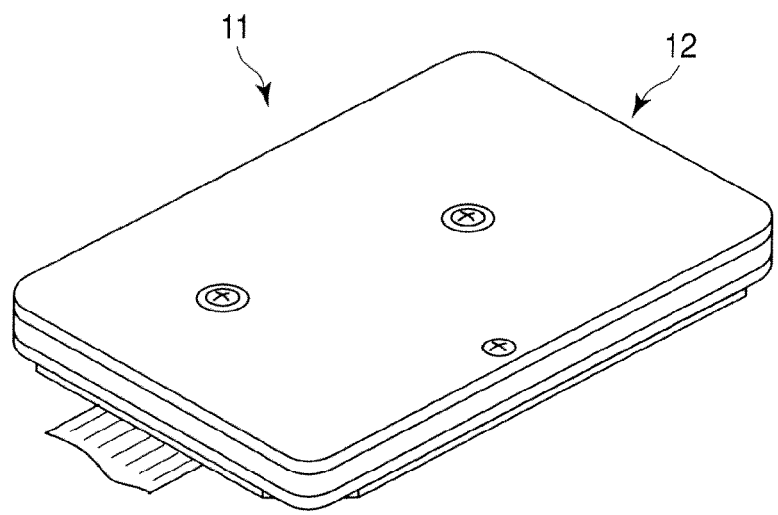
FIG. 1 is an exemplary perspective view showing a hard disk drive which is an example of an electronic apparatus according to the first embodiment.

FIG. 1 shows a hard disk drive 11, which is an example of an electronic apparatus. The hard disk drive 11 is incorporated in a personal computer, for example, and functions as a storage device for storing various kinds of data.

Figure 2:
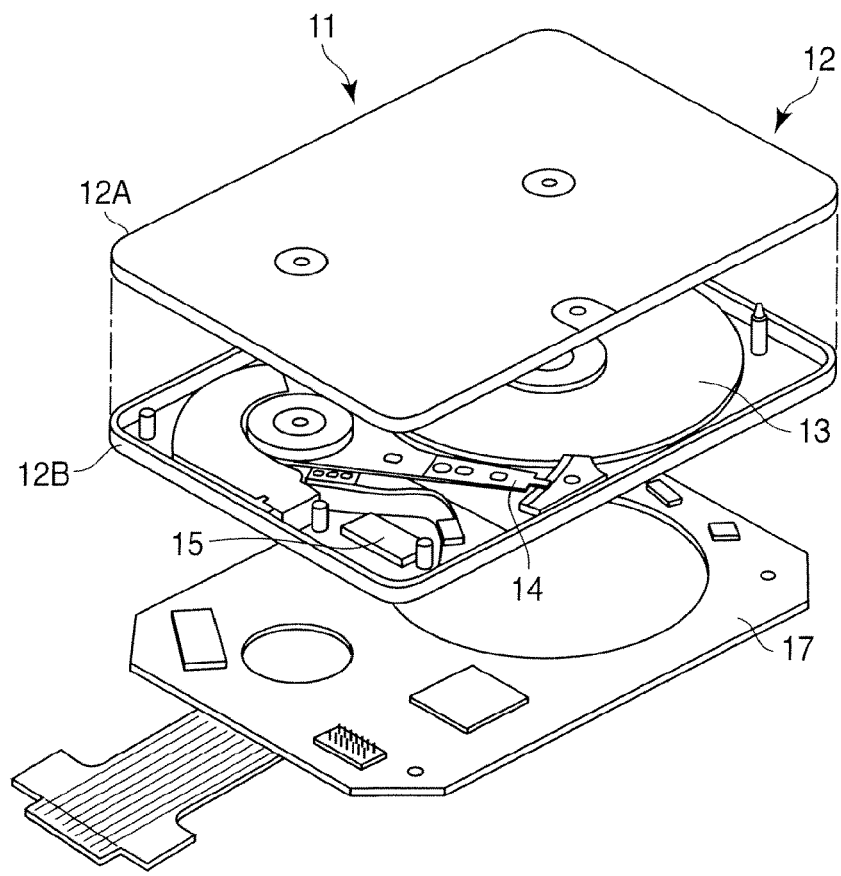
FIG. 2 is an exemplary perspective view showing the hard disk drive of FIG. 1 in an exploded manner.

As shown in FIGS. 1-3, the hard disk drive 11 comprises: a metallic case 12; a magnetic disk 13, a head 14 and a first printed circuit board 15 which are contained in the case 12; a fixing member 16 configured to fix the first printed circuit board 15 to the case 12; and a second printed circuit board 17 provided external of the case 12. The second printed circuit board 17 is a general type of copper clad laminated plate having rigidity.

The case 12 is a so-called shield case and is shaped like a rectangular box. The case 12 includes an upper first case 12A and a lower second case 12B. In the present embodiment, the case 12 is a metallic case but is not limited to this. The case 12 may be a synthetic resin case, and a shield layer made of a conductive metal may be formed on the inner surface of the synthetic case.

As shown in FIG. 4, the fixing member 16 is a general type of screw, and serves both to physically fix the first printed circuit board 15 and the case 12 to each other and to electrically connect the first printed circuit board 15 and the case 12 to each other (ground connection).

The fixing member 16 includes a shaft portion 16A and a head portion 16B at one end of the shaft portion 16A. The shaft portion 16A is inserted into a through-hole 21 (described later) formed in the first printed circuit board 15. The radius of the head portion 16B is larger than that of the shaft portion 16A. When the head portion 16B is brought into contact with a cover film 24, it covers a certain area on the cover film 24. In the present embodiment, the fixing member 16 is a screw but may be another type of fixing means, such as a rivet joint.

As shown in FIG. 5, the first printed circuit board 15 is a flexible printed circuit board. The first printed circuit board 15 comprises the through-hole 21 described above, and the fixing member 16 can be inserted into the through-hole 21. The fixing member 16 serves to fix the first printed circuit board 15 to the case 12 and electrically connect the first printed circuit board 15 to the case 12. When the first printed circuit board 15 is electrically connected to the case 12, the first printed circuit board 15 and the case 12 have the same potential. Accordingly, the emission of electromagnetic waves from the first printed circuit board 15 can be significantly suppressed.

As shown in FIGS. 4 and 5, the first printed circuit board 15 includes: a base film 22 formed of polyimide and having insulation characteristics; copper foil 23 formed on the base film 22 and having a predetermined pattern; and a cover film 24 having insulation characteristics and covering the copper foil 23. The cover film 24 has an opening portion 25 to permit part of the copper film 23 to be exposed. Except at the position where the opening portion 25 is formed, the cover film 24 covers the copper foil 23. The cover film 24 is formed of polyimide. The term "opening portion" 25 used herein is intended to refer to film portions that define the periphery of an opening 26.

As shown in FIGS. 4 and 5, the opening portion 25 is located at a position covered with the head portion 16B of the fixing member 16. The opening portion 25 is elliptical, for example. Although the opening portion 25 is at the position covered with the head portion 16B of the fixing member 16, it is located away from the through-hole 21.

A conductive material is provided on the copper foil 23 on the inner wall of the opening portion 25. The conductive material serves to electrically connect the copper foil 23 and the fixing member 16 to each other. In the present embodiment, the conductive material is a soldering material 27, for example. As shown in FIG. 4, the soldering material 27 electrically connects the copper foil 23 on the first printed circuit board 15 to the head portion 16B of the fixing member 16.

A description will be given with reference to FIGS. 6 and 7 of a method in which the fixing structure of the present embodiment is formed. As shown in FIG. 6, paste of the soldering material 27 is supplied (printed) onto the copper foil 23 on the inner side of the opening portion 25. Subsequently, various types of circuit components are mounted on the first printed circuit board 15. In this state, the first printed circuit board 15 is carried into a reflow furnace to melt the soldering material 27. Thereafter, the soldering material 27 is left to harden. As shown in FIG. 7, the fixing member 16 is inserted into the through-hole 21 and fastened in such a manner that the top portion of the hardened soldering material 27 is pressed and flattened with the head portion 16B of the fixing material 16. As a result, the soldering material 27 is changed to have a shape that ensures reliable contact between the fixing member 16 and the soldering material 27. In this manner, a sealing structure is formed wherein the copper foil 23 and the soldering material 27 (which may be a cause of the generation of dust) are sealed with the fixing member 16 and the opening portion 25.

The hard disk drive 11 according to the first embodiment comprises: a case 12; a printed circuit board provided inside the case 12 and including a through-hole 21; a fixing member 16 comprising a shaft portion 16A inserted into the through-hole 21 and a head portion 16B located at one end of the shaft portion, the fixing member 16 being configured to fix the printed circuit board and the case 12 to each other; copper foil 23 provided on the printed circuit board; a cover film 24 provided at a position where the opening portion 25 for exposing the part of the copper foil 23 is covered with the head portion 16B, and configured to cover the copper foil 23 at positions other than the opening portion 25; and a conductive material provided on the copper foil 23 on the inner side of the opening portion 25 and electrically connecting the head portion 16B and the copper foil 23 to each other.

In general, the soldering material 27, an example of a conductive material, may have needle-like whiskers, and they may be a main cause of dust generated inside the electronic apparatus. In addition, the copper foil 23 provided on the printed circuit board may oxidize and become a copper oxide. Therefore, the copper foil 23 may also be a main cause of dust. On the other hand, a precision electronic apparatus, such as the hard disk drive 11, requires a very high level of cleanness inside a case 12.

In the structure described above, the copper foil 23 and the conductive material are sealed with the head portion 16B of the fixing member 16 and the opening portion 25 of the cover film 24. Since dust caused by the copper foil 23 and the conductive material does not scatter inside the hard disk drive 11, the interior of the case 12 of the hard disk drive 11 can be kept clean. Because of this, the hard disk drive 11 is prevented from malfunctioning due to dust.

The opening portion 25 is located away from the throughhole 21. This structure prevents a conductive material from entering the through-hole 21 undesirably, and the fixing member 16 can be smoothly inserted into the through-hole 21.

A description will now be given with reference to FIGS. 8 through 12 of modifications of the connection structure of the first embodiment. In the connection structure shown in FIG. 8, the back side of the first printed circuit board 15, which is a flexible circuit board, is reinforced by a plate member 28 made of stainless steel. The first printed circuit board 15 includes a through-hole 21, and a fixing member 16 can be inserted into this through-hole 21. The first printed circuit board 15 comprises: a base film 22; copper foil 23 formed on the base film 22 and having a predetermined pattern; and a cover film 24 having insulation characteristics and covering the copper foil 23. The cover film 24 has an opening portion 25 to permit part of the copper film 23 to be exposed. Except at the position where the opening portion 25 is formed, the cover film 24 covers the copper foil 23. The opening portion 25 is elliptical and formed along the circumference of the through-hole 21. On the inner side of the opening portion 25, a conductive material is provided on the copper foil 23 to electrically connect the copper foil 23 and the fixing member 16 to each other. The conductive material is a soldering material 27.

Figure 8:
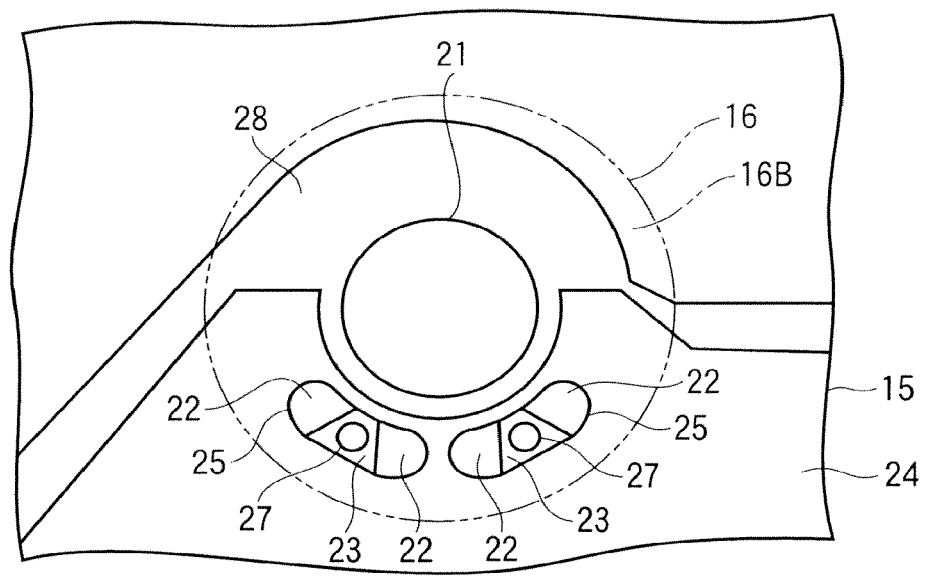
FIG. 8 is an exemplary plan view showing a first modification of the connection structure of the first embodiment.
Figure 9:
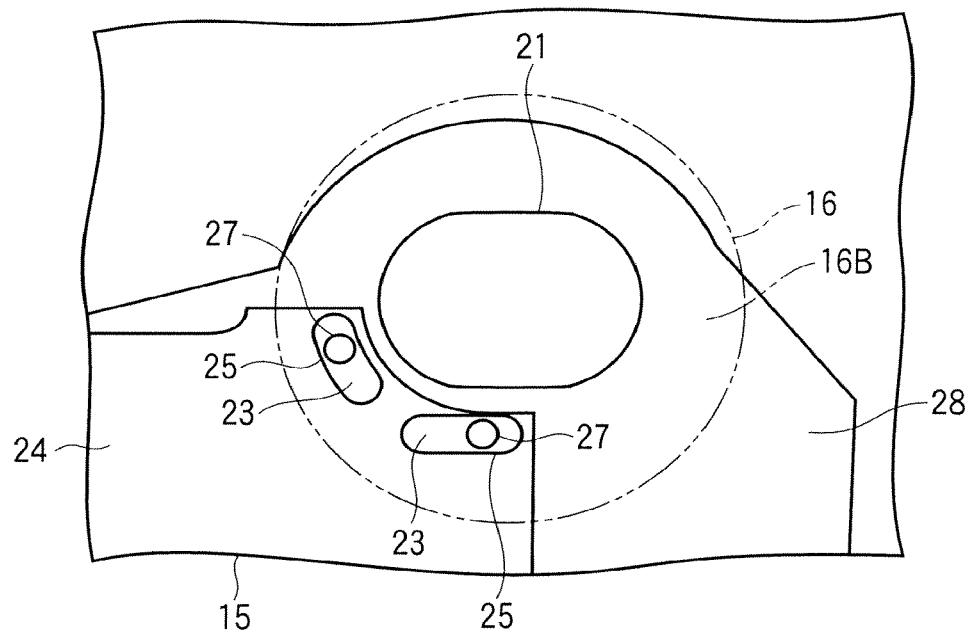
FIG. 9 is an exemplary plan view showing a second modification of the connection structure of the first embodiment.

In the connection structure shown in FIG. 9, a plate member 28 made of stainless steel is used for reinforcement from the back side, as in the connection structure shown in FIG. 8. An opening portion 25 permits copper foil 23 to be exposed, and a soldering material 27 serving as a conductive material is provided on the copper foil 23 on the inner side of the opening portion 25. The soldering material electrically connects the copper foil 23 to a fixing member 16.

Figure 10:
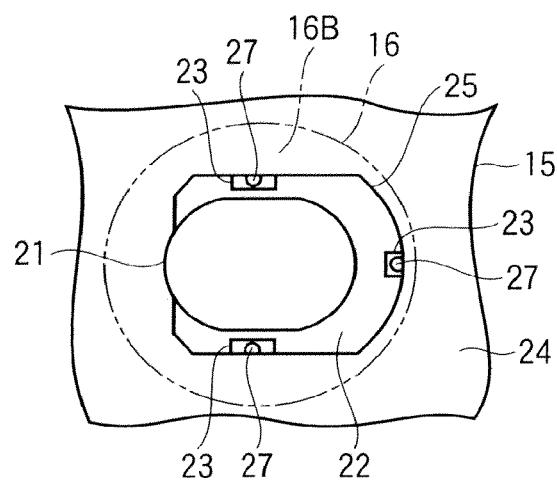
FIG. 10 an exemplary plan view showing a third modification of the connection structure of the first embodiment.

In the connection structure shown in FIG. 10, a throughhole 21 is elliptical, and the opening portion 25 of a cover film 24 is elongated in accordance with the elliptical shape of the through-hole 21. On the inner side of the opening portion 25, copper foil 23 is provided at three positions on the periphery of the through-hole 25. On the inner side of the opening 25, a soldering material 27, namely a conductive material, is provided on the copper foil 23. The soldering material 27 electrically connects the copper foil 23 to a fixing member 16. The connection structure is featured in that the soldering material 27 is sealed in the region surrounded by the opening portion 25 of the cover film 24 and the head portion 16B of the fixing member 16. Therefore, dust arising from the soldering material 27 does not leak outward.

Figure 11:
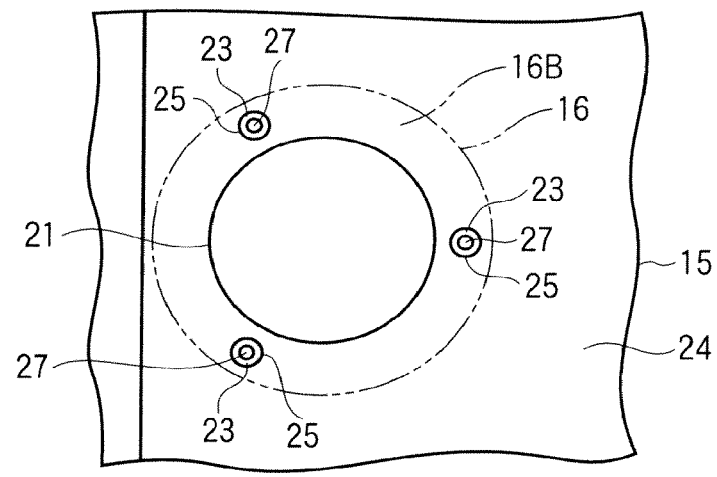
FIG. 11 is an exemplary plan view showing a fourth modification of the connection structure of the first embodiment.

In the connection structure shown in FIG. 11, an opening portion 25 of a cover film 24 is provided at three positions on the circumference of a circular through-hole 21. The opening portion 25 is circular, and copper foil 23 is provided at the position exposed by the opening portion 25. On the inner side of the opening portion 25, a soldering material 27 serving as a conductive material is provided on the copper foil 23. The soldering material 27 electrically connects the copper foil 23 to a fixing member 16. The connection structure is featured in that the soldering material 27 is sealed in the region surrounded by the opening portion 25 of the cover film 24 and the head portion 16B of the fixing member 16. Therefore, dust arising from the soldering material 27 does not leak outward.

Figure 12:
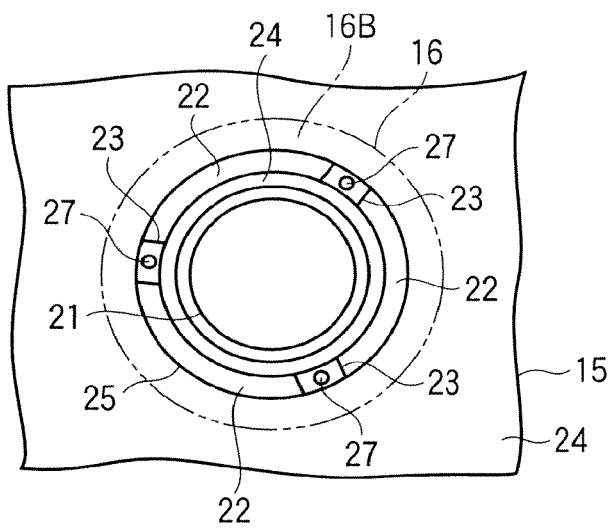
FIG. 12 is an exemplary plan view showing a fifth modification of the connection structure of the first embodiment.

The connection structure shown in FIG. 12 comprises a ring-shaped first cover film 24, and a second cover film 24 provided around the first cover film 24 and covering copper foil 23. In the connection structure, an annular region is surrounded by the outer circumference of the first cover film 24 and a circular opening portion 25 of the second cover film 24. In the region between the outer circumference of the first cover film 24 and the opening portion 25 of the second cover film 24, a soldering material 27 serving as a conductive material is provided on the copper foil 23. The soldering material 27 electrically connects the copper foil 23 to a fixing member 16. The connection structure is featured in that the soldering material 27 is sealed in the region surrounded by: the outer circumference of the first cover film 24; the opening portion 25 of the second cover film 24; and the head portion 16B of the fixing member 16. Therefore, dust arising from the soldering material 27 does not leak outward.

An electronic apparatus according to the second embodiment will now be described with reference to FIGS. 13 and 14. A hard disk drive 11, which is an example of the electronic apparatus according to the second embodiment, differs from that of the first embodiment in that it comprises a seal member 31. In the other points, the hard disk drive 11 of the second embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the second embodiment looks similar to what is shown in FIG. 1.

In the second embodiment, a ring-shaped seal member 31 is provided around the head portion 16B of a fixing member 16. The seal member 31 is formed of a synthetic resin material and has elasticity like that of rubber. When the fixing member 16 is inserted into a through-hole 21 and secured, the fixing member 16 is fastened in such a manner that the seal member 31 is pressed and flattened. As a result, the region inside of the seal member 31 is sealed. The seal member 31 is in no way limited to a synthetic resin material. For example, an adhesive, a washer made of stainless steel, or another suitable material or member may be used as the seal member 31.

In the second embodiment, the seal member 31 surrounds the head portion 16B. Even if dust leaks from inside the opening portion 25, the dust stays in the region inside the seal member 31 and does not scatter inside a case 12. Where the seal member 31 is made of a material having elasticity like that of rubber, the fixing member 15 can be reliably prevented from loosening.

An electronic apparatus according to the third embodiment will now be described with reference to FIG. 15. A hard disk drive 11, which is an example of the electronic apparatus according to the third embodiment, differs from that of the first embodiment in that it comprises a plurality of pieces of copper foil 23 and is provided with an opening portion 25 having a different shape from that of the first embodiment. In the other points, the hard disk drive 11 of the third embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the third embodiment looks similar to what is shown in FIG. 1.

The third embodiment differs from the first embodiment in that a plurality of copper foil pieces 23 are provided on a base film 22 of a first printed circuit board 15 at positions away from one another. The copper foil pieces 23 are arranged radially around a through-hole 21. The opening portion 25 of a cover film 24 is circular and permits a wide area of the region around the through-hole 21 to be exposed. The opening portion 25 is formed in such a manner that it can be covered with the head portion 16B of a fixing member 16. The opening portion 25 permits the copper foil pieces 23 to be exposed collectively.

A soldering material 27, serving as a conductive material, is provided on each of the copper foil pieces 23. The soldering material 27 electrically connects the head portion 16B of the fixing member 16 to the copper foil pieces 23. With this structure, the copper foil pieces 23 on the first printed circuit board 15 are electrically connected to a case 12 through the fixing member 16.

In the third embodiment, a plurality of copper foil pieces 23 are provided radially around the through-hole 21 on the printed circuit board, and a conductive material is provided on each of the copper foil pieces 23. With this structure, the conductive material can be uniformly arranged around the through-hole 21. Even if there is a level difference between a portion where the conductive material is provided and a portion where no conductive material is provided, the conductive material can be uniformly arranged around the through-hole 21. Accordingly, the fixing member 16 inserted in the through hole is prevented from slanting.

Figure 17:
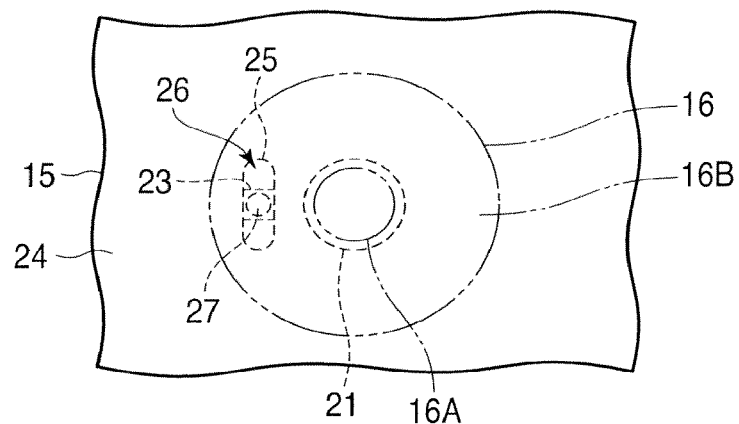
FIG. 17 is an exemplary plan view showing the first printed circuit board of the hard disk drive depicted in FIG. 16.

An electronic apparatus according to the fourth embodiment will now be described with reference to FIGS. 16 and 17. A hard disk drive 11, which is an example of the electronic apparatus according to the fourth embodiment, differs from the hard disk drive 11 of the first embodiment in that a printed circuit board 15 is brought into contact with a case by use of a surface opposite to that of the first embodiment. In the other points, the hard disk drive 11 of the fourth embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the fourth embodiment looks similar to what is shown in FIG. 1.

In the fourth embodiment, the first printed circuit board 15 is fixed to the case 12 in the state where a cover film 24, not a base film 22, is in contact with the case 12. That is, the opening portion 25 of the cover film 24 is in tight contact with the case 12. On the inner side of the opening portion 25, a soldering material 27, an example of a conductive material, is provided on copper foil 23. The soldering material 27 electrically connects the copper foil 23 to the case 12. In this state, a fixing member 16 is inserted into a through-hole 21 and fastened, and the first printed circuit board 15 is secured to the case 12.

The fourth embodiment is featured in that the opening portion 25 of the cover film 24 is in tight contact with the case 12. Therefore, dust arising from the copper foil 23 and the conductive material can be confined to the region inside the opening portion 25. Accordingly, the dust is prevented from scattering inside the case 12.

Figure 18:
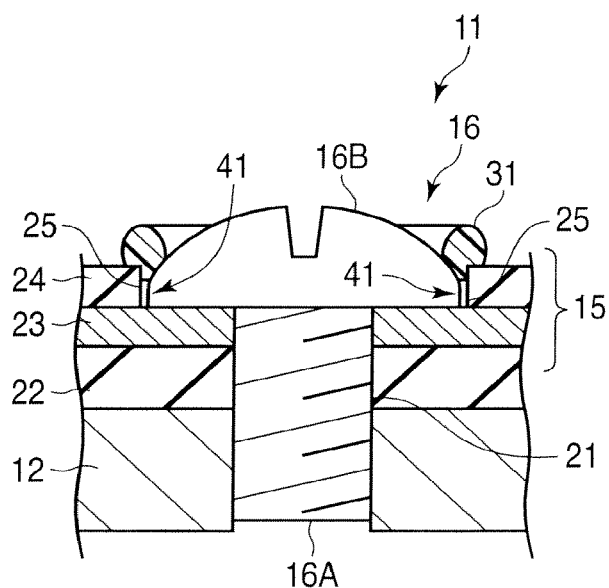
FIG. 18 is an exemplary longitudinal sectional view of a fixing member and a first printed circuit board employed in a hard disk drive, which is an example of an electronic apparatus according to the fifth embodiment.

An electronic apparatus according to the fifth embodiment will now be described with reference to FIGS. 18 and 19. A hard disk drive 11, which is an example of the electronic apparatus according to the fifth embodiment, differs from the hard disk drive 11 of the first embodiment in terms of the position where a fixing member 16 is provided and in that a seal member 31 is provided and a conductive material is not provided. In the other points, the hard disk drive 11 of the fifth embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the fifth embodiment looks similar to what is shown in FIG. 1.

In the fifth embodiment, an opening portion 25 is circular and permits copper foil to be exposed around a through-hole 21. The head portion 16B of a fixing member 16 is fitted inside the opening portion 25 and is therefore in direct contact with the copper foil 23. A seal member 31 is provided around the head portion 16B of the fixing member 16. The seal member 31 serves to seal the gap 41 between the circumference of the head portion 16B and the opening portion 25 of the cover film 24. The seal member 31 is formed by coating an adhesive or the like in a ring-shaped pattern.

In the fifth embodiment, the gap 41 between the circumference of the head portion 16B and the opening portion 25 is sealed by means of the seal member 31. Therefore, dust arising from the copper foil 23 can be confined to the region between the circumference of the head portion 16B and the opening portion 25. Dust does not scatter inside the case 12 and therefore does not become a cause of malfunction.

An electronic apparatus according to the sixth embodiment will now be described with reference to FIGS. 20 and 21. A hard disk drive 11, which is an example of the electronic apparatus according to the sixth embodiment, differs from the hard disk drive 11 of the first embodiment in that an opening portion 25 is not provided in a cover film 24 and a conductive material is not used. In the other points, the hard disk drive 11 of the sixth embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the sixth embodiment looks similar to what is shown in FIG. 1.

In the sixth embodiment, the cover film 24 does not have an opening portion and covers all surface portions of the copper foil 23 except at the position where a through-hole 21 is provided. As shown in FIG. 20, the copper foil 23 comprises a portion, specifically end portion 23A, projected toward the inside region of the through-hole 21. As shown in FIGS. 20 and 21, when a fixing member 16 is inserted into the through-hole 21 of the first printed board 15, the end portion 23A projected into the inside region of the through-hole 21 is bent, and the copper foil 23 and the fixing member 16 are electrically connected together. Since the fixing member 16 is electrically connected to a case 12, the electrical connection between the first printed circuit board 15 and the case 12 is attained.

In the sixth embodiment, the copper foil 23 is covered with the cover film 24 and comprises a portion which projects toward the inside region of the through-hole 21 and which is electrically connected to the fixing member 16. With this structure, the copper foil 23 is exposed to the outside only at portions located inside the through hole 21, and is covered with the head portion 16B of the fixing member 16 at positions in the vicinity of the exit of the through-hole 21. Thus, dust generated from the portion of the copper foil 11 exposed in the through-hole 21 does not scatter inside a case 12, and a hard disk drive 11 is prevented from malfunctioning.

Figure 23:
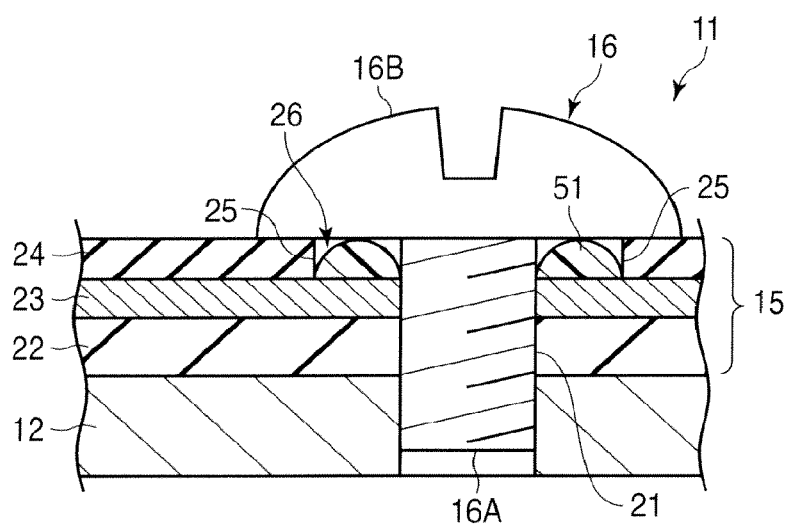
FIG. 23 is an exemplary sectional view illustrating a step subsequent to the step of forming the fixing structure of the hard disk drive depicted in FIG. 22.

An electronic apparatus according to the seventh embodiment will now be described with reference to FIGS. 22 and 23. A hard disk drive 11, which is an example of the electronic apparatus according to the seventh embodiment, differs from the hard disk drive 11 of the first embodiment in that a conductive adhesive 51 is used as the conductive material described above. In the other points, the hard disk drive 11 of the seventh embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the seventh embodiment looks similar to what is shown in FIG. 1.

In the seventh embodiment, the conductive adhesive 51, serving as the conductive material described above, is coated inside the opening portion 25 of a cover film 24. The conductive adhesive 51 is obtained by mixing metallic powder in the resin component of an adhesive, and therefore provides conductivity. As shown in FIG. 22, the conductive adhesive 51 is annular, located inside the opening portion 25 of the cover film 24, and formed along the periphery of the at the periphery of a through-hole 21.

To form the fixing structure of the seventh embodiment, the conductive adhesive 51 is coated on the inside of the opening 25. Before the conductive adhesive 51 hardens, a fixing member 16 is fastened relative to the through-hole 21, and the conductive adhesive 51 is pressed and flattened with the head portion 16B of the fixing member 16. In this manner, the electrical connection between copper foil 23 and a case 12 is established while maintaining the tight contact between a fixing member 16 and a first printed circuit board 15.

In the seventh embodiment, the conductive adhesive 51 is used as a conductive material in place of the soldering material 27 described above, and reliable electrical connection between the copper foil 23 and the case 12 is ensured. Since the conductive adhesive 51 serves to connect the fixing member 16 to the first printed circuit board 15, the fixing member 16 is prevented from loosening.

Figure 24:
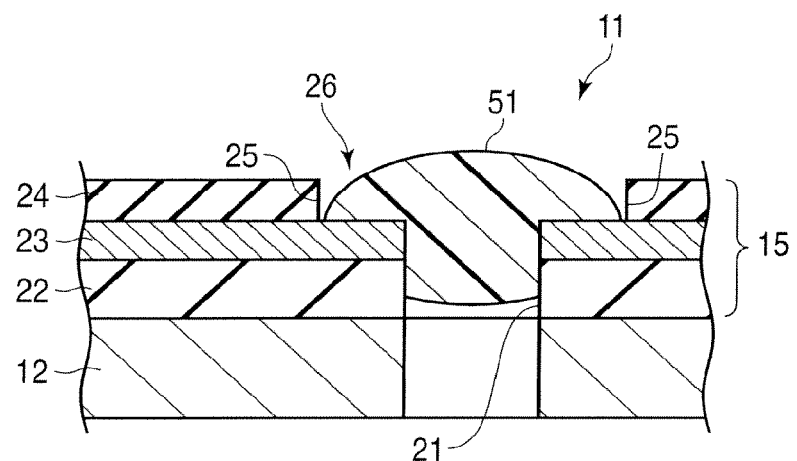
FIG. 24 is an exemplary sectional view illustrating a step of forming a fixing structure of a hard disk drive, which is an example of an electronic apparatus according to the eighth embodiment.
Figure 25:
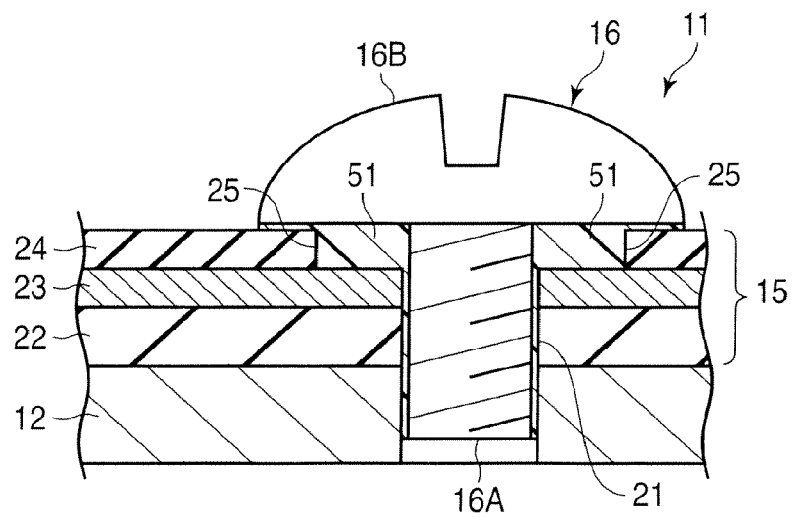
FIG. 25 is an exemplary sectional view illustrating a step subsequent to the step of forming the fixing structure of the hard disk drive depicted in FIG. 24.

An electronic apparatus according to the eighth embodiment will now be described with reference to FIGS. 24 and 25. A hard disk drive 11, which is an example of the electronic apparatus according to the eighth embodiment, differs from the hard disk drive 11 of the first embodiment, for example, in that a conductive adhesive 51 is used as the conductive material described above. In the other points, the hard disk drive 11 of the eighth embodiment is similar to that of the first embodiment. In the description below, reference will be made only to the different features. The same reference numerals as used above will be used to denote similar or corresponding structural elements, and a repetitive description of such elements will be omitted. The hard disk drive 11 of the eighth embodiment looks similar to what is shown in FIG. 1.

In the fixing structure of the eighth embodiment, the conductive adhesive 51 is coated inside the opening portion 25 of the cover film 24 as a block in such a manner as to close a through-hole 21. Before the conductive adhesive 51 hardens, a fixing member 16 is fastened relative to the through-hole 21 of a first printed circuit board 15 on which the conductive adhesive 51 is coated. By so doing, the gap between the fixing member 16 and the through-hole 21 and the gap between the fixing member 16 and the opening portion 25 of the cover film 24 can be completely filled with the conductive adhesive 51.

In the eighth embodiment, reliable electrical connection between the copper foil 23 of the first printed circuit board 15 and a case 12 is ensured even though the conductive adhesive 51 is used as a conductive material. In addition, the fixing member 16 is reliably prevented from loosening owing to the use of the conductive adhesive 51.

An electronic apparatus according to the ninth embodiment will now be described with reference to FIGS. 26 and 27. A portable computer 61, which is an example of the electronic apparatus according to the ninth embodiment, will be described. The portable computer 61 differs from the electronic apparatus of the first embodiment in terms of the outward appearance and general structure, but is similar to the electronic apparatus in terms of the fixing structure of a first printed circuit board it employs. In the description below, reference will be made only to the different features. The same reference numerals as used above will be used to denote similar or corresponding structural elements, and a repetitive description of such elements will be omitted.

Figure 26:
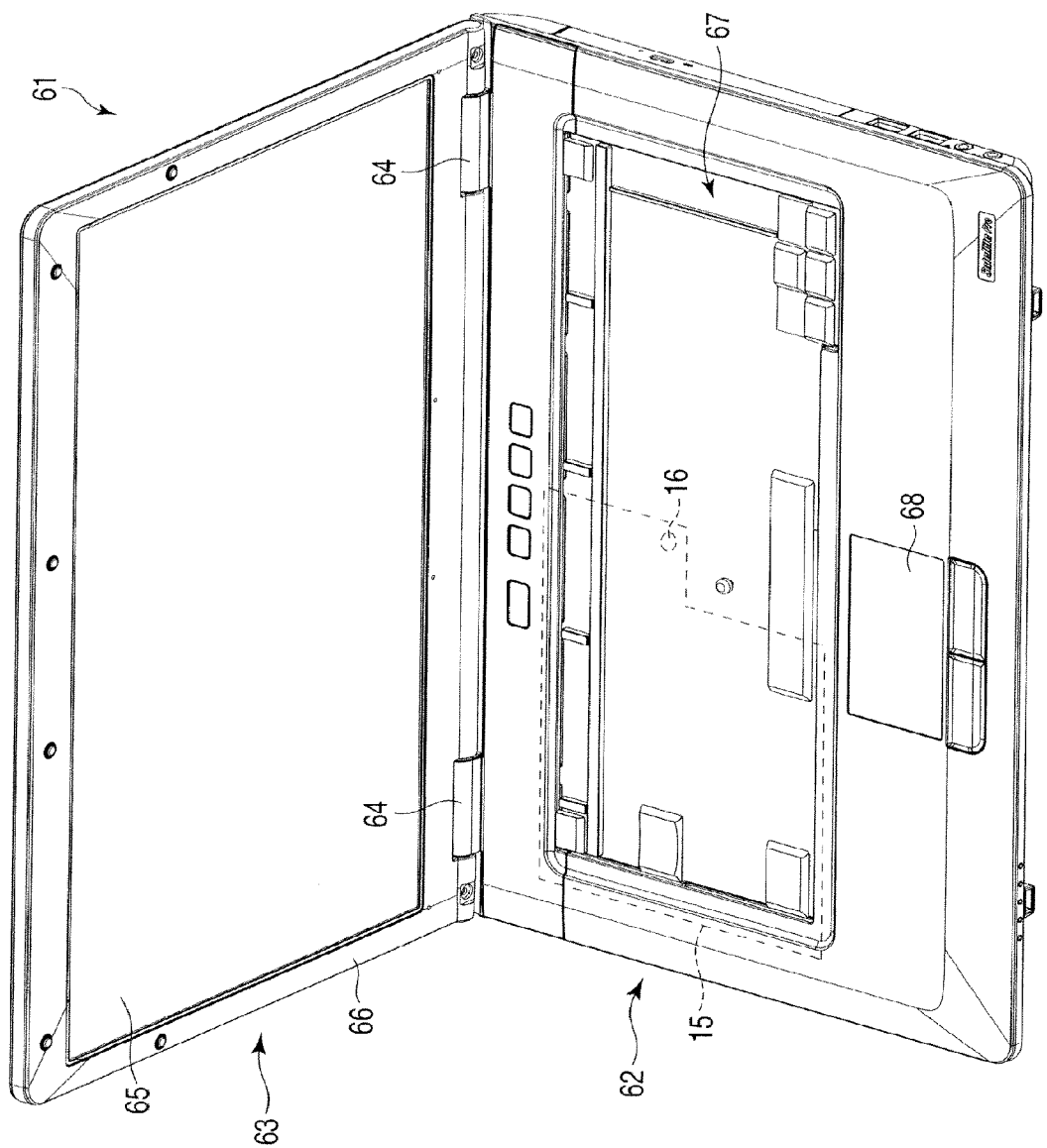
FIG. 26 is an exemplary perspective view of a portable computer, which is an example of an electronic apparatus according to the ninth embodiment.

As shown in FIG. 26, the portable computer 61 comprises a main body unit 62, a display unit 63, and hinges 64 provided between the main body unit 62 and the display unit 63. The hinges 64 rotatably support the display unit 63.

The display unit 63 comprises a display 65 and a display case 66 made of synthetic resin and surrounding the display 65.

The main body unit 62 comprises a box-like case 12 made of synthetic resin, a keyboard unit 67 attached to the upper surface of the case 12, a touch pad 68 provided on the upper surface of the case 12, a first printed circuit board 15 contained inside the case 12, and a fixing member 16 configured to fix the first printed circuit board 15 to the case 12. As in the foregoing embodiments, the fixing member 16 is a general type of screw. Not all of the keys of the keyboard unit 67 not shown.

Figure 27:
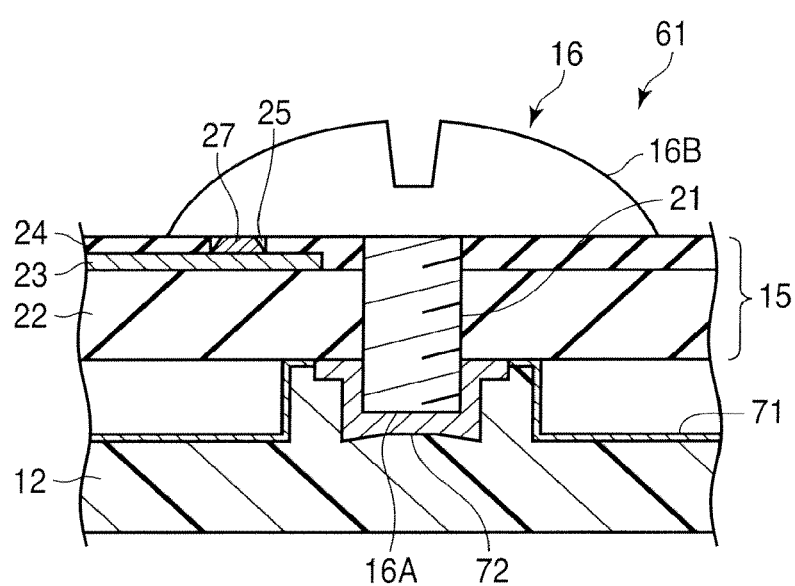
FIG. 27 is an exemplary longitudinal sectional view of a fixing member and a first printed circuit board, which are employed in the portable computer depicted in FIG. 26.

As shown in FIG. 27, a shield layer 71 comprising a conductive metallic coating on the inner surface thereof is provided inside the case 12. A boss is provided inside the case 12, and an insert 72 made of a metallic material is embedded in the boss.

Unlike the printed circuit boards of the foregoing embodiments, the first printed circuit board 15 is a general type of copper clad laminated plate having rigidity. The first printed circuit board 15 is a main board on which a plurality of circuit components (not shown) are mounted, including a CPU, a RAM and a ROM.

As shown in FIG. 27, the opening portion 25 of a cover film 24 is provided at a position to be covered with the head portion 16B of a fixing member 16. A soldering material 27 serving as a conductive material is provided on copper foil 23 on the inner side of the opening portion 25. The soldering material 27 is electrically connects the copper foil 23 of the first printed circuit board 15 and the head portion 16B of a fixing member 16 to each other. In this manner, the first printed circuit board 15 is electrically connected to the shield layer 71 of the case 12 by way of the fixing member 16. In the ninth embodiment, a base 22 is rigid and is made of epoxy resin.

The ninth embodiment is directed to a fixing structure the portable computer 61 employs for fixing the first printed circuit board 15, and the fixing structure of the ninth embodiment ensures reliable electrical connection between the copper foil 23 and the case 12. The opening portion 25 of the cover film 24 is located at a position which is to be covered with the head portion 16B of the fixing member 16. With this structure, the region inside the opening portion 25 is sealed, and dust generated from the copper foil 23 and the conductive material is prevented from leaking out of the opening portion 25, thus effectively preventing a cause of malfunction.

The electronic apparatuses are not limited to the hard disk drives 11 and portable computer 61 described in relation to the foregoing embodiments. For example, the electronic apparatuses may be a cellular phone or other types of electronic apparatuses. Needless to say, the electronic apparatuses can be modified in various ways without departing from the scope and spirit of the invention when they are reduced to practice.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
    a case;
    a printed circuit board contained in the case and comprising a through-hole;
    a fixing member comprising a shaft portion inserted in the through-hole and a head portion located at one end of the shaft portion, and configure to fix the printed circuit board and the case to each other, and to be electrically connected with the case;
    a copper foil provided on the printed circuit board;
    a cover film covering at least a portion of the copper foil and comprising an opening portion configured to expose a part of the copper foil, the opening portion being covered with the head portion; and
    a conductive material provided on the copper foil inside the opening portion and configured to electrically connect the head portion and the copper foil to each other, wherein the conductive material is enclosed in the opening portion of the cover film by the head portion and an inner surface of the opening portion,
    wherein the copper foil and the conductive material are sealed with the head portion and the opening portion of the cover film, and the conductive material is flushed with a top surface of the cover film which is covered by the head portion.

2. The electronic apparatus of claim 1, where the opening portion is located at a position away from the through-hole.

3. The electronic apparatus of claim 1, further comprising:
    a seal member configured to seal periphery of the head portion.

4. The electronic apparatus of claim 1, wherein the copper foil is arranged radially around the through-hole on the printed circuit board.

5. The electronic apparatus of claim 1 being a hard disk drive.

6. The electronic apparatus of claim 1, further comprising a seal member configured to seal a gap between periphery of the head portion and the opening portion, wherein the head portion is fitted inside the opening portion.

7. An electronic apparatus comprising:
    a case;
    a printed circuit board contained in the case, the printed circuit board comprises a through-hole;
    a fixing member that comprises a shaft portion inserted in the through-hole and a head portion located at one end of the shaft portion, the fixing member is configured to (i) fix the printed circuit board and the case to each other and (ii) provide electrical connectivity with the case;
    a copper foil provided on the printed circuit board;
    a cover film covering a first portion of the copper foil, the cover film comprises an opening portion configured to expose a second portion of the copper foil, the opening portion being covered by the head portion; and
    a conductive material provided on the copper foil inside the opening portion and configured to electrically couple the head portion and the copper foil to each other, the conductive material is positioned in the opening portion of the cover film and enclosed by the head portion and an inner side of the opening portion of the cover film,
    wherein the copper foil and the conductive material are sealed with the head portion and the opening portion of the cover film, and the conductive material is flushed with a top surface of the cover film which is covered by the head portion.

8. The electronic apparatus of claim 7, where the opening portion is located at a position offset from the through-hole.

9. The electronic apparatus of claim 8, where the opening portion is located at the position offset from the through-hole to prevent the conductive material from entering the through-hole.

10. The electronic apparatus of claim 7 being a hard disk drive.

* * * * *